(12) United States Patent
Bowler et al.

(10) Patent No.: US 6,420,928 B1
(45) Date of Patent: Jul. 16, 2002

(54) AC COUPLED PRE-AMPLIFIER FOR BURST SIGNAL

(75) Inventors: David B. Bowler, Andover; Colby Dill, III, Holliston; Barry D. Colella, Newburyport, all of MA (US)

(73) Assignee: Quantum Bridge Communications, Inc., Andover, MA (US)

( * ) Notice: Subject to any disclaimer, the term of this patent is extended or adjusted under 35 U.S.C. 154(b) by 0 days.

(21) Appl. No.: 09/845,263

(22) Filed: Apr. 30, 2001

(51) Int. Cl.$^7$ ................................................. H03F 3/45
(52) U.S. Cl. ........................ 330/69; 330/112; 330/141; 330/281
(58) Field of Search ........................... 330/69, 112, 141, 330/281

(56) References Cited

U.S. PATENT DOCUMENTS

| | | | |
|---|---|---|---|
| 3,909,739 A | * 9/1975 | Niimi | 330/69 |
| 5,430,766 A | 7/1995 | Ota et al. | 375/318 |
| 5,737,366 A | 4/1998 | Gehlot | 375/238 |
| 5,818,620 A | 10/1998 | Akimoto et al. | 359/189 |

\* cited by examiner

*Primary Examiner*—Michael B Shingleton
(74) *Attorney, Agent, or Firm*—Hamilton, Brook, Smith & Reynolds, P.C.

(57) ABSTRACT

An AC-coupled pre-amplifier is provided for amplifying a signal received in a packet transmitted in burst mode. The pre-amplifier provides a fast time constant for a driven edge of a received signal and a slower time constant for a undriven edge of the received signal. The decay of the undriven edge is faster than the inter-packet time between two received packets. The dual response times, allows for the inter-packet time to be less than the longest string of constant data received in a packet.

6 Claims, 18 Drawing Sheets

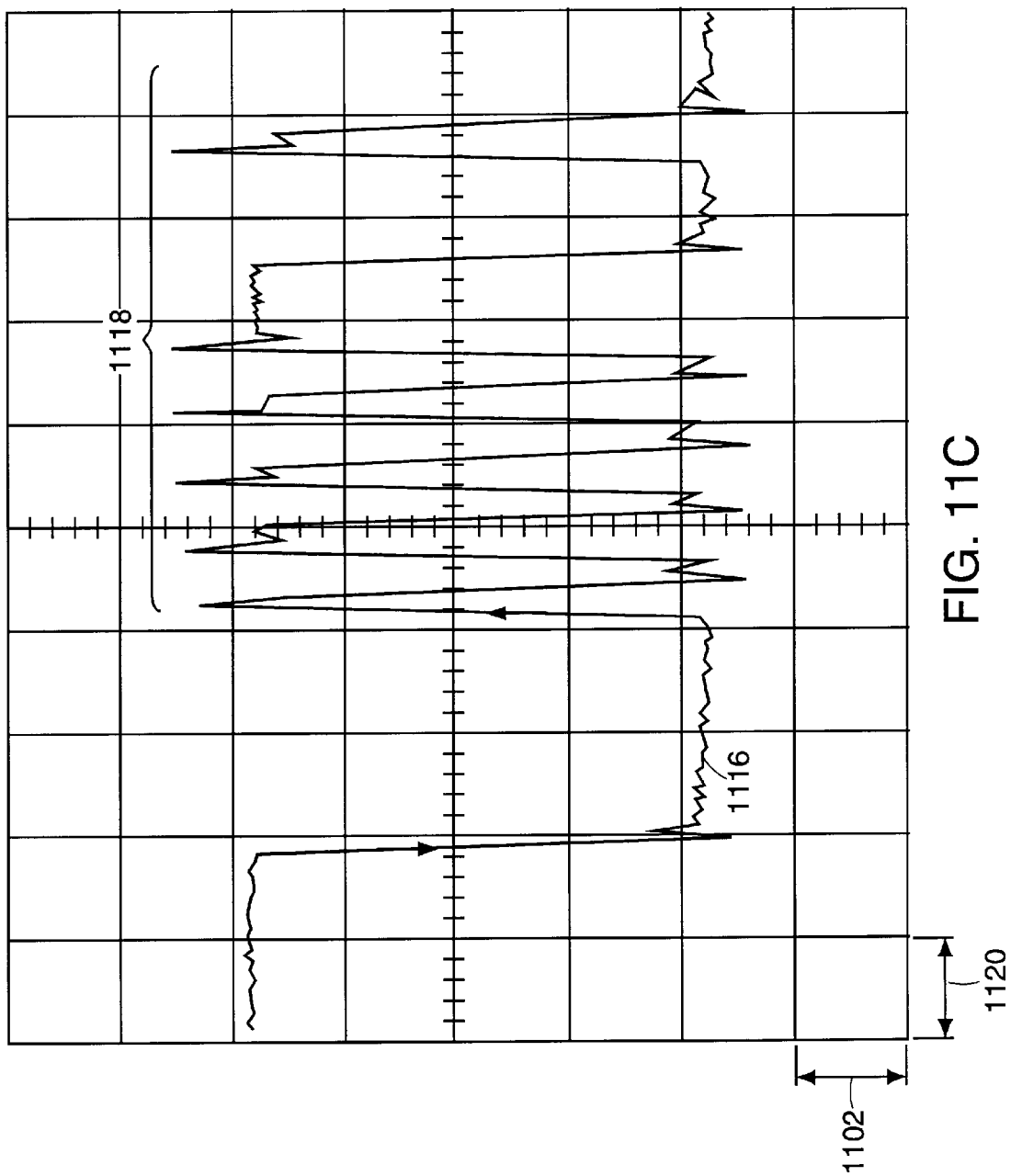

AC COUPLED PRE-AMPLIFIER FOR BURST SIGNAL

RELATED APPLICATION

This application is related to co-pending U.S. Patent Application entitled "AC-coupled Burst Mode Receiver With Wide Dynanic Range" by Bowler et. al., U.S. Ser. No. 09/845,243, filed on Apr. 30, 2001, the entire teachings of which are incorporated herein by reference.

BACKGROUND OF THE INVENTION

Many communications networks today provide high bit-rate transport over a shared medium, such as a Passive Optical Network ("PON"), a Cable television ("CATV") coaxial or hybrid fiber/coax network, or a wireless network. These shared medium networks typically use time, frequency or code division multiplexing to transport data signals from a central terminal to several remote customer terminals and Time Division Multiple Access ("TDMA") to transport data signals from the remote terminals to the central terminal. TDMA is characterized by non-continuous or burst mode data transmission.

In existing optical networks, especially in a PON system, each "packet" of information from a remote terminal is multiplexed in a time sequence on one fiber and transmitted in a burst-like manner. Such burst mode packets transmitted from one or more remote terminals to a receiver at the central terminal present a number of constraints to the receiver. The receiver is likely to receive closely spaced packets that have a wide range of optical power levels. A weak signal in a received packet needs to be amplified sufficiently so that it can be used, but if a strong signal in a packet is amplified too much the signal can be lost due to blinding (saturating) the amplifier. The difference in power levels of the incoming packets may be such that the noise induced on a powerful signal in one packet may be greater than a weak signal in a subsequent packet.

In burst mode, a guard time is provided between packets. Typically, the guard time is the time to transmit 8 bits. For example, at 6 nano-seconds ("ns") per bit, the time to transmit 8 bits is 48 ns. Thus, the receiver must be able to respond to a packet with a different power level in less than 8 bit times. The power ratio between sequential packets can be greater than 1000:1. The receiver also has to respond to a weak signal in a subsequent packet within the guard time between packets.

An incoming packet can include a long string of bits set to logic 'one' or logic 'zero'. The receiver has to maintain the output at a constant logic level while the string of bits set to logic 'one' or logic 'zero' is being received. However, the string of bits set to logic 'one' or logic 'zero' may be longer, up to three times longer or more, than the guard time between packets.

A burst mode receiver can be AC coupled or DC coupled. Prior art AC coupled receivers cannot maintain the voltage level for a long string of 'ones' or 'zeros' in a packet and also respond to a weak signal in a subsequent packet within the guard time between packets. Therefore, the AC coupled receiver may drop bits in the next packet while adapting to the new power level.

In a DC coupled receiver, a rapidly responding Automatic Gain Control ("AGC") is used to keep an amplifier from saturating on the noise or logic 'zero' power level on a strong incoming signal. However, AGC can produce severe Pulse Width Distortion ("PWD") after receiving a long string of 'ones' or 'zeros' in a packet at a high power level. Furthermore, the AGC must be extremely fast. This limits the incoming data rate at which the DC coupled receiver can operate because as the incoming data rate increases, so does the speed required for the AGC.

SUMMARY OF THE INVENTION

In accordance with the present invention, an AC-coupled pre-amplifier outputs an amplified signal with an undriven time constant that is longer than a driven time constant.

The AC-coupled pre-amplifier has a capacitor for AC-coupling a signal and an amplifier. The amplifier has an inverting input and a non-inverting input. The non-inverting input is coupled to the capacitor to receive the AC coupled signal. An input resistor is coupled between the inverting input and the non-inverting input. A feedback resistor is coupled between a positive output of the amplifier and the non-inverting input of the amplifier. The ratio of the input resistor the feedback resistor and open loop gain of the amplifier is selected to produce an undriven time constant for each undriven edge of the AC coupled signal. The undriven time constant is proportional to the capacitor and the input resistor. The undriven time constant is longer than the driven edge time constant but shorter than an inter-packet guard time.

The edge rate of the signal, and the ratio between an input drive current driving the signal and the capacitor control the driven time constant for each driven edge of the AC coupled signal.

A second feedback resistor may be coupled between a negative output of the amplifier and the inverting input of the amplifier and a second capacitor included for AC-coupling a second signal. The inverting input of the amplifier is connected to the second capacitor to receive the second AC-coupled signal. The ratio of the input resistor the second feedback resistor and the open loop gain of the amplifier is selected to produce an undriven time constant for each undriven edge of the second AC coupled signal. The ratio is chosen such that the undriven edge time constant is longer than the driven edge time constant but shorter than an inter-packet guard time.

The edge rate of the second signal, and the ratio between the input drive current driving the second signal and the second capacitor control the driven time constant for each driven edge of the second AC coupled signal.

A method for pre-amplifying a signal, AC-couples the signal through an AC-coupling capacitor to output an AC-coupled signal. The AC-coupled signal is amplified in an amplifier. The amplifier has a positive feedback resistor coupled between a non-inverting input and a positive output and an input resistor coupled between the non-inverting input and an inverting input. The ratio between the feedback resistor, the input resistor and the gain of the amplifier are selected to output an amplified AC-coupled signal having a driven edge time constant corresponding to each driven edge of the incoming AC-coupled signal and an undriven edge time constant extended and longer than the driven edge time constant corresponding to each undriven edge of the AC-coupled signal. The undriven edge time constant is less than a guard time between burst mode signals.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are necessarily to scale, emphasis instead being placed upon illustrating the principles of the invention.

FIGS. 11A–11C are measured traces of digital signals at the input of the burst mode receiver and the output of the burst mode receiver shown in FIG. 3.

DETAILED DESCRIPTION OF THE INVENTION

A description of preferred embodiments of the invention follows.

The principles of the present invention are now described with reference to an embodiment in a Passive Optical Network ("PON") system. However, it should be understood that the principles of the present invention are applicable to other shared medium networks that use burst mode transmission.

Figure 1:
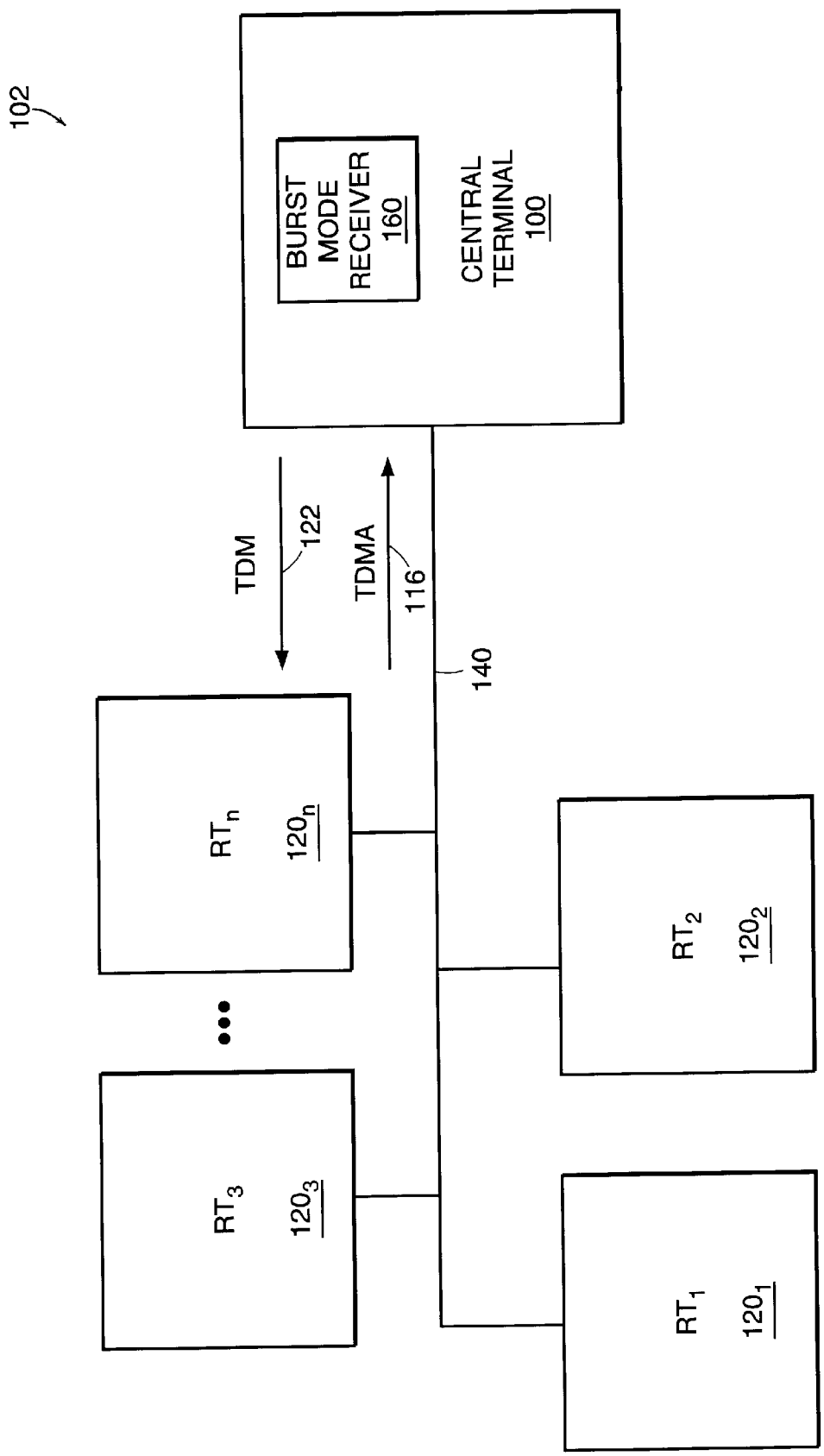
FIG. 1 is a block diagram of an optical access system.

FIG. 1 is a block diagram of an optical access system 102. The optical access system 102 includes a central terminal or hub 100, remote terminals $120_{1-N}$ and a PON 140. The optical access system 102 provides a downstream data signal 122 over the ON 140 from the central terminal 100 to the remote terminals $120_{1-N}$ using Time Division Multiplexing ("TDM") transmission over the media. An upstream data signal 116 from the remote terminals $120_{1-N}$ to the central terminal 100 over the PON 140 is provided in burst transmissions using Time Division Multiple Access ("TDMA"). The central terminal 100 includes a burst mode receiver 160 for receiving packets transmitted from one or more remote terminals $120_{1-N}$.

Note that the terms downstream and upstream are used herein to refer to the direction of transmission signal flow. The downstream direction refers to signals from the central terminal 100 toward the remote terminals $120_{1-N}$. The upstream direction refers to signals from the remote terminals $120_{1-N}$ toward the central terminal 100.

Figure 2A:
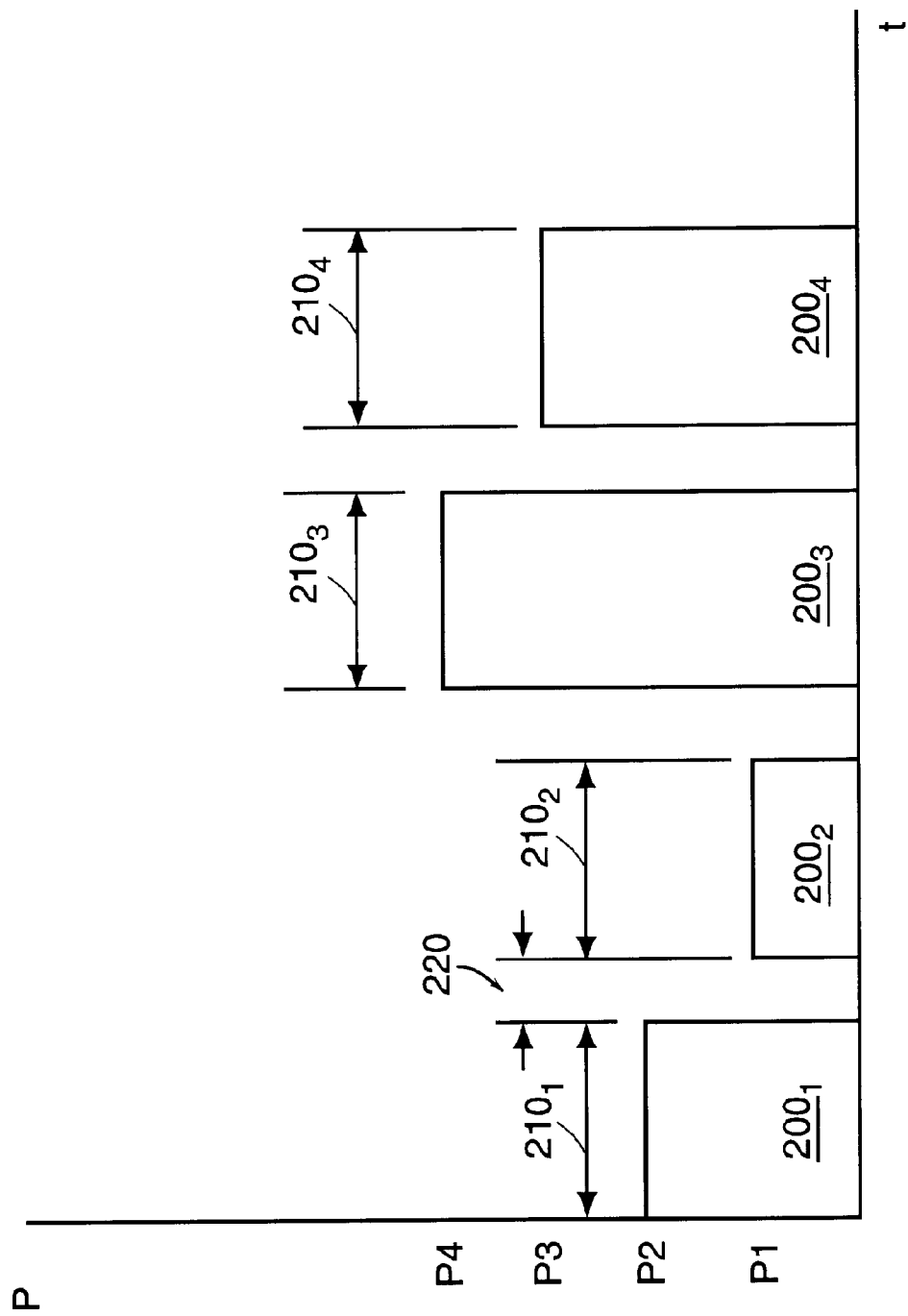
FIG. 2A is a graph illustrating power levels of a plurality of packets received by the burst mode receiver over the PON shown in FIG. 1.

FIG. 2A is a graph illustrating power levels of a plurality of packets $200_1$–$200_4$ received by the receiver 160 over the PON 140 shown in FIG. 1. Each packet $200_1$–$200_4$ is transmitted in its respective time slot $200_1$–$200_4$ from its respective remote terminal $120_{1-N}$ over the PON 140 to the receiver 160 (FIG. 1).

As shown in FIG. 2A, the power levels of received data packets $200_{1-4}$ range from $P_1$ to $P_4$ with $P_1$ being the lowest power level and $P_4$ being the highest power level. Packet 200, with power level $P_2$ is received, then packet 2002 with the lowest power level $P_1$ is received followed by packet $200_3$ with the highest power level $P_4$. Then, packet $200_4$ is received with power level $P_3$. The receiver 160 (FIG. 1) has to handle the change in power level between packets $200_1$–$200_3$ within the guard time 220. For example, if $P_4$ is –7 dBm and $P_1$ is –32 dBm the receiver 160 (FIG. 1) has to handle packet $200_2$ with power level of –32 dBm, followed by packet $200_3$ with power level of –7 dBm.

In a typical burst mode system, a packet $200_{1-4}$ can include long strings of bits without transitions which are transmitted in a time slot $210_{1-4}$. The guard time or inter-packet spacing time 220 between two packets $200_{1-4}$ may be less than the longest string of bits without transitions.

Figure 2B:
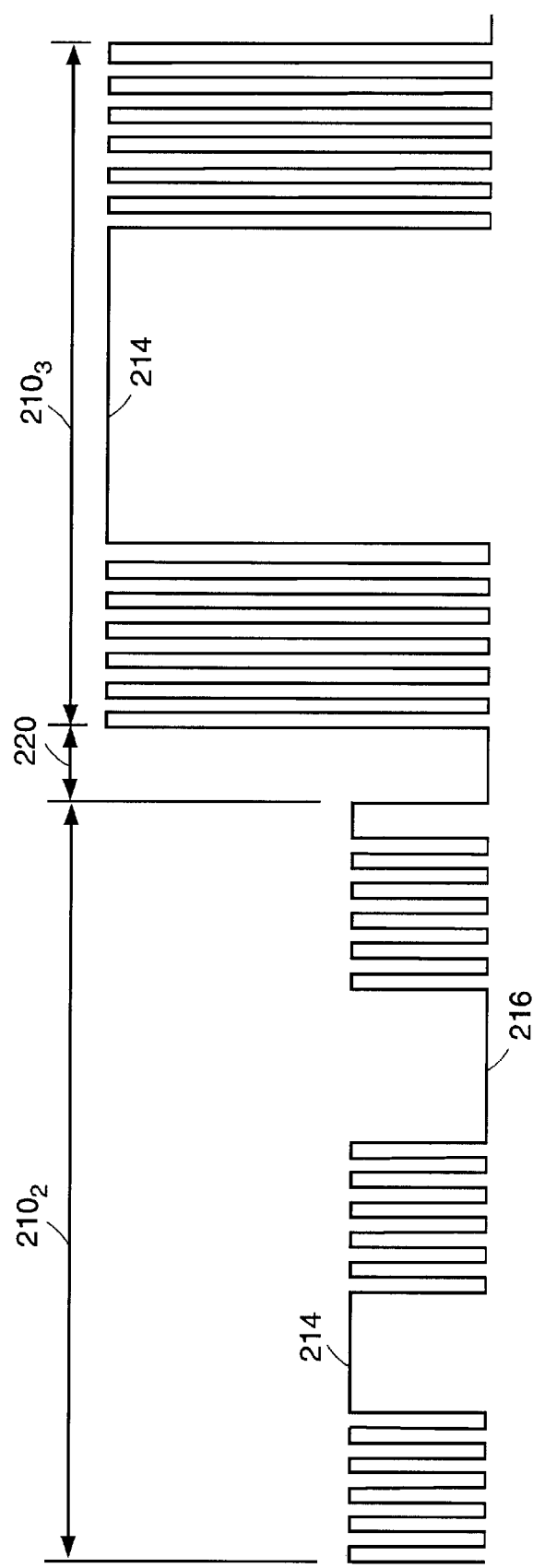
FIG. 2B illustrates the data in two of the received packets shown in FIG. 2A.

FIG. 2B illustrates the data in two of the received packets $200_2$, $200_3$ shown in FIG. 2A. As shown in FIG. 2A, the power level of packet $200_2$ is $P_1$ and the power level of packet $200_3$ is $P_4$. Each packet $200_2$, $200_3$ transmitted in its respective time slot $210_2$, $210_3$ includes sequences of bits set to a logic 'one' or a logic 'zero'. The voltage level of the sequences of bits set to a logic 'one' or a logic 'zero' is dependent on the power level of the packet. Packet $200_2$ (FIG. 2A) received in time slot $210_2$ includes a sequence of bits set to logic 'one' 214 and a sequence of bits set to 'zero' 216 between a sequence of bits which change from "one" to "zero". Packet $200_3$ (FIG. 2A) received in time slot $210_3$ includes a sequence of bits set to logic 'one' 214 between sequences of bits which change from logic 'one' to 'zero'. The sequence of bits set to logic 'one' 214 and sequence of bits set to 'zero' 216 in the received packets $200_2$, $200_3$ (FIG. 2A) are longer than the guard time 220 between packets $200_2$, $200_3$ (FIG. 2A).

Figure 3:
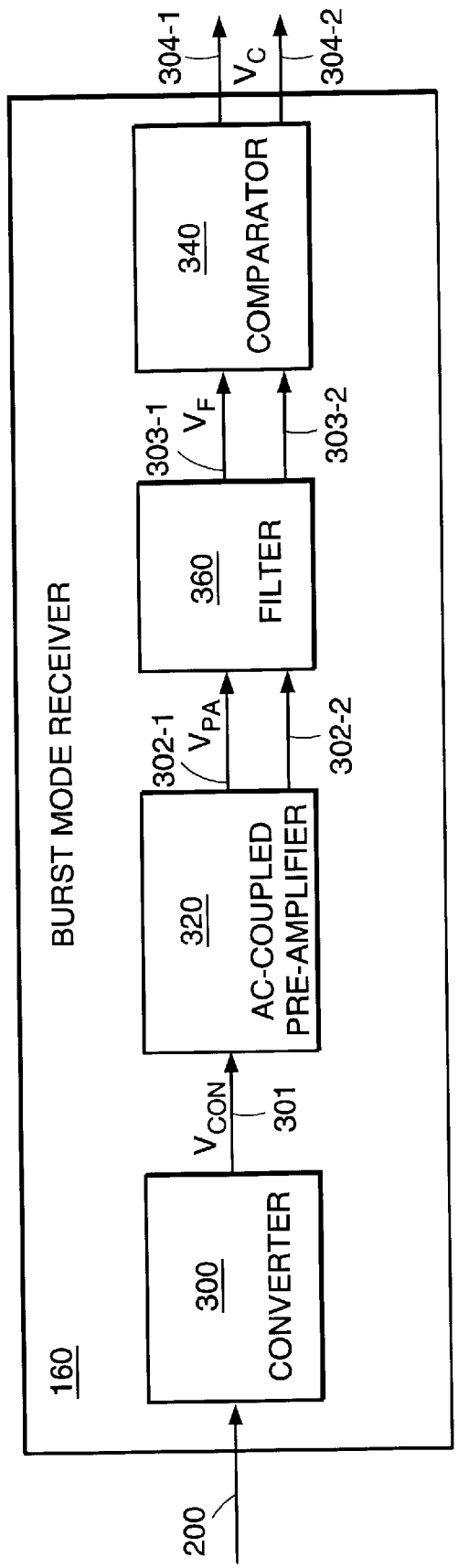
FIG. 3 is a block diagram of a burst mode receiver in the central terminal shown in FIG. 1 according to the present invention.

FIG. 3 is a block diagram of the burst mode receiver 160 in the central terminal 100 shown in FIG. 1 according to the present invention. The burst mode receiver 160 provides a digital signal 304 corresponding to a received optical signal 200. The burst mode receiver 160 of the present invention includes a converter 300, an AC-coupled pre-amplifier 320, a filter 360 and a comparator with hysteresis 340.

The converter 300 converts an optical signal 200 to an electrical signal 301. The AC-coupled pre-amplifier 320 provides a voltage signal having a slowly decaying voltage level for a long string of 'ones' or 'zeros' within a received packet on the electrical signal 301. The filter 360 is coupled between the pre-amplifier 320 and the comparator with hysteresis 340 to reduce noise on the amplified voltage signal 302. A comparator with hysteresis 340 ignores the slowly decaying power level of a long string of 'ones' or 'zeros' within the filtered signal 303 and does not overwrite the power level of the long string on the digital signal 304 until it detects the end of the string.

Figure 4:
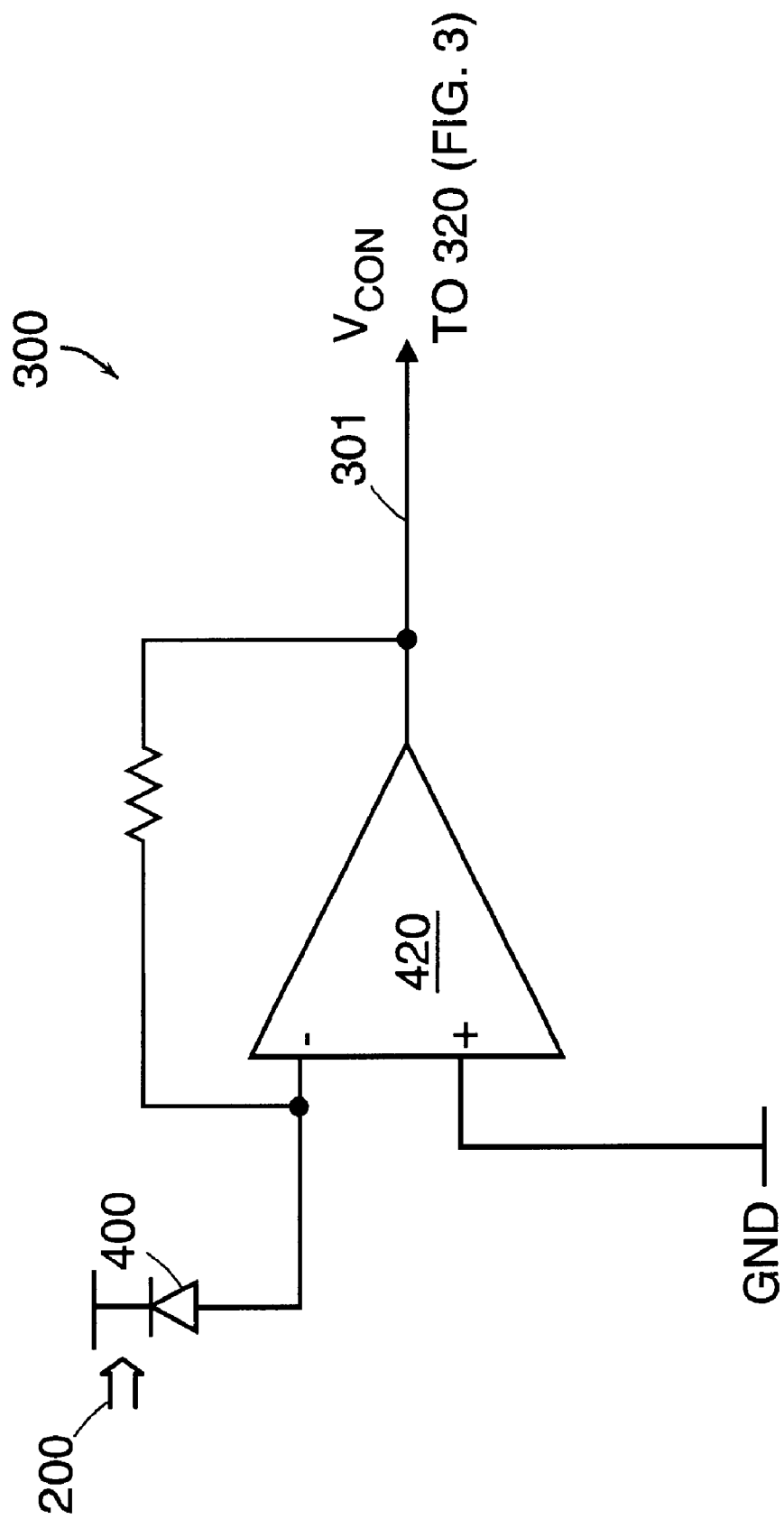
FIG. 4 is a circuit diagram of the converter in the burst mode receiver shown in FIG. 3.

FIG. 4 is a circuit diagram of the converter 300 in the burst mode receiver 160 shown in FIG. 3. The converter 300 includes an optical to electrical convertor. One example is a P-I-N (P-type doped material-Intrinsically doped material-N-type doped material) diode 400 and a TransImpedance Amplifier ("TIA") 420. The P-I-N diode 400 is a photo diode operated with a reverse bias voltage and thus behaves as a current source when illuminated. The P-I-N diode 400 converts the received optical signal 200 to an electrical current. The optical signal 200 includes data which can be encoded using well-known encoding techniques such as, Non-Return-to-Zero ("NRZ"), Differential NRZ, Manchester or Return-to-Zero ("RZ"). The TIA 420 functions as a current to voltage converter. The electrical current provided by the P-I-N diode 400 is converted by the TIA 420 to an electrical signal $V_{CON}$ 301 representative of the optical signal 200. Returning to FIG. 3, the output of the converter 300 is coupled to the AC-coupled pre-amplifier 320.

Figure 5A:
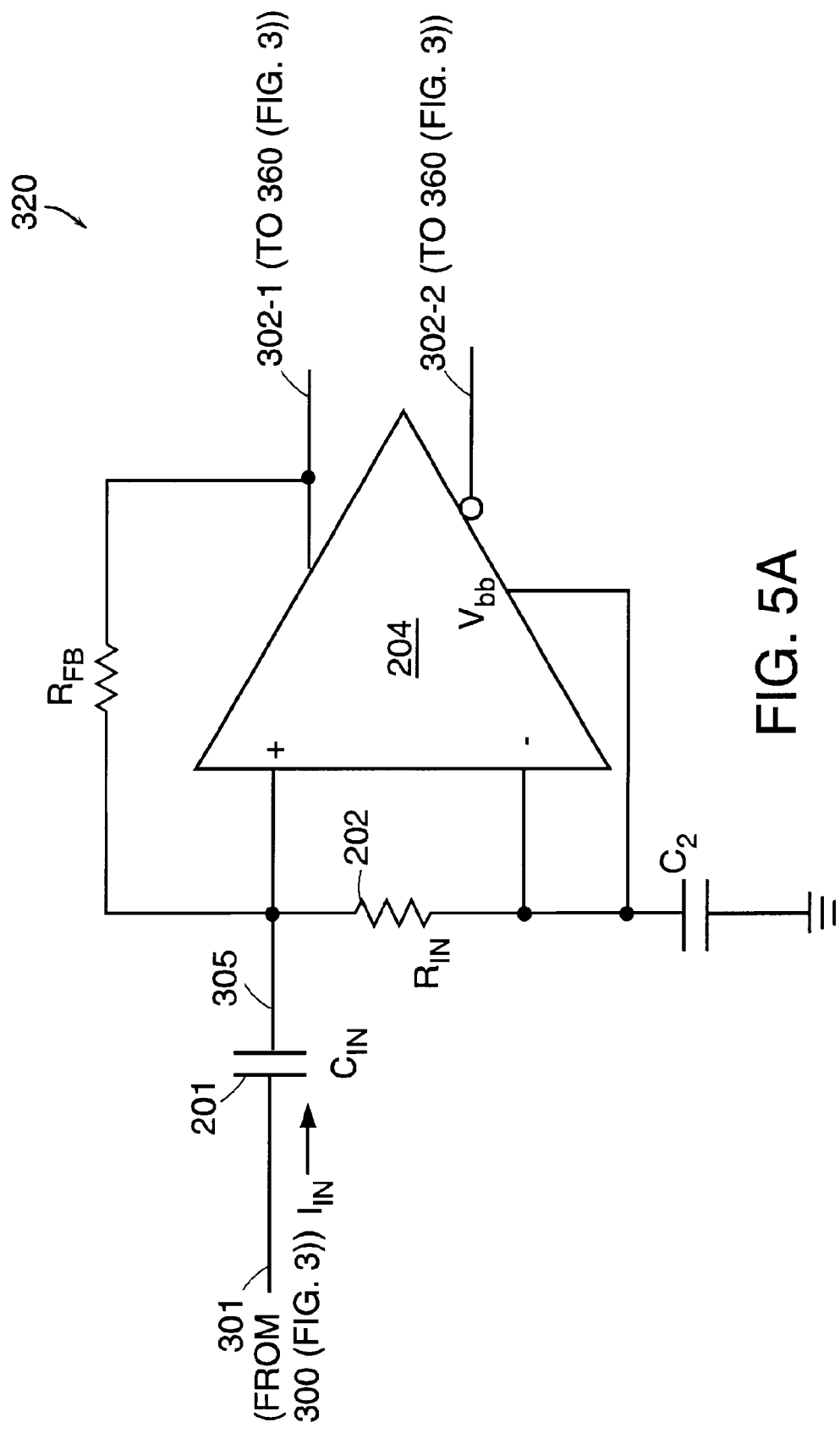
FIG. 5A is a circuit diagram of an embodiment of the AC-coupled pre-amplifier in the burst mode receiver shown in FIG. 3.

FIG. 5A is a circuit diagram of an embodiment of the AC-coupled pre-amplifier 320 in the burst mode receiver 160 shown in FIG. 3. The AC-coupled pre-amplifier 320 includes a differential amplifier 204. A differential amplifier is an amplifier that responds to the difference between two input voltages. The input terminals of the differential amplifier are called the non-inverting and the inverting inputs. The output voltage of the differential amplifier is dependent on the difference between the two input voltages.

Figure 5B:
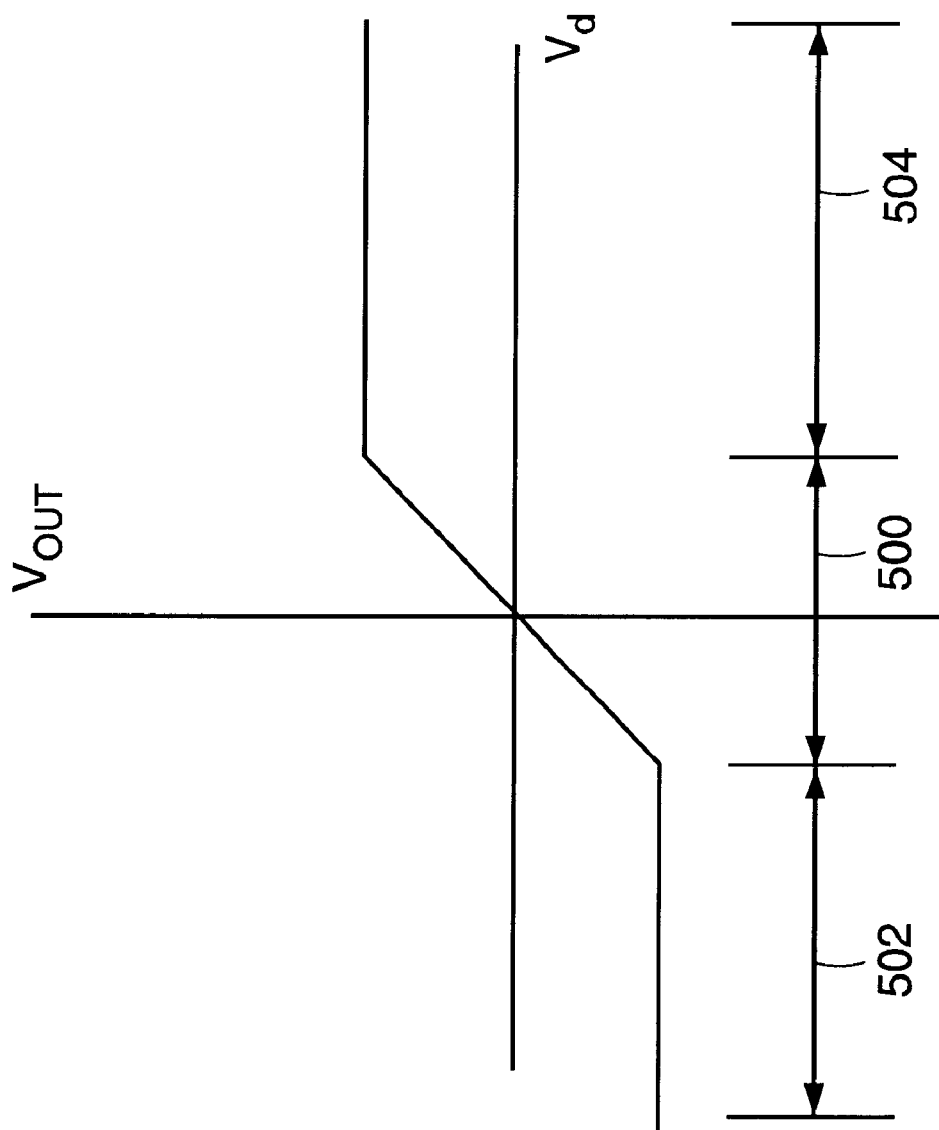
FIG. 5B illustrates an ideal transfer curve for a differential amplifier showing the relationship between the output voltage and the difference in voltage between the two input voltages.

FIG. 5B illustrates an ideal transfer curve for a differential amplifier showing the relationship between the output voltage $V_{OUT}$ and the difference in voltage $V_d$ between the two input voltages. The transfer curve includes a linear region 500. The linear region 500 is bounded by positive saturation 504 and negative saturation 502. The slope of the linear region 500 is called the open-loop gain of the differential amplifier. The output voltage $V_{OUT}$ is computed using the following equation:

$$V_{OUT} = AV_d = A(V_p - V_n)$$

where:

A=gain;

$V_d$=difference in voltage between inputs of the differential amplifier;

$V_p$=input voltage at the non-inverting terminal;

$V_n$=input voltage at the inverting terminal; and $V_{OUT}$=0 when $V_p = V_n$.

Increasing $V_p$ results in $V_{OUT}$ increasing in the positive direction. Increasing $V_n$ results in $V_{OUT}$ increasing in the negative direction. The differential amplifier has the highest gain in the linear region 500, where the differential voltage $V_d$ is small.

Returning to FIG. 5A, a coupling capacitor ($C_{in}$ 201 is coupled between the output of the converter 300 (FIG. 3) and the positive input of the differential amplifier 204. A coupling capacitor couples an Alternating Current ("AC") signal from one ungrounded point to another. The coupling capacitor acts like a switch that is open to AC current and closed to DC current. This allows an AC signal to be transmitted without disturbing DC biasing. The coupling capacitor 201 provides an AC-coupled electrical signal 305 corresponding to the electrical signal 301 provided by the converter 300. The AC-coupled electrical signal 305 is coupled to the positive input of the differential amplifier 204.

Figure 5C:
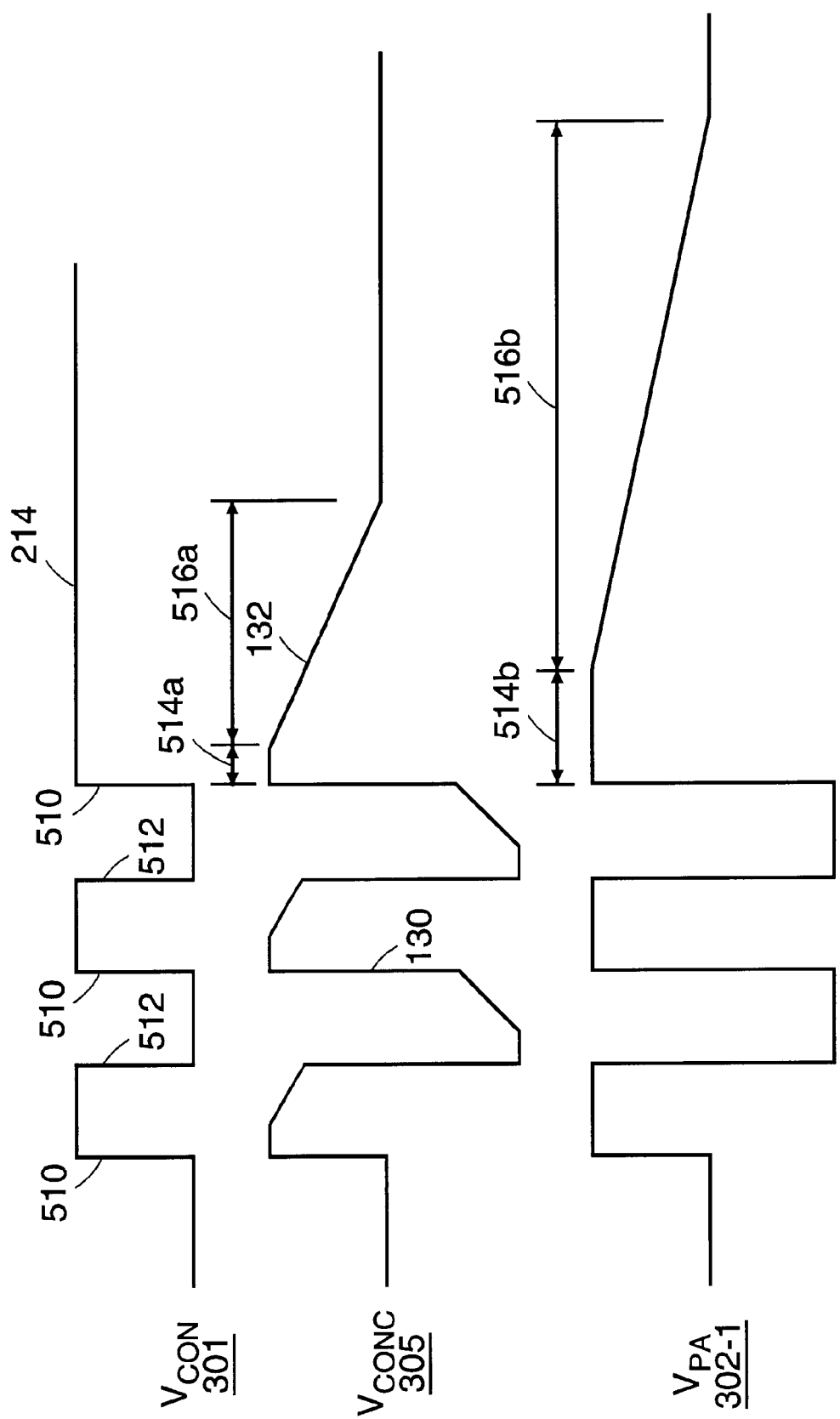
FIG. 5C is a timing diagram illustrating the electrical signal, the corresponding AC-coupled electrical signal and the positive output of the differential amplifier for a portion of a received packet in the embodiment of the pre-amplifier shown in FIG. 5A.

FIG. 5C is a timing diagram illustrating the electrical signal $V_{CON}$ 301 (FIG. 5A), the corresponding AC-coupled electrical signal $V_{CONC}$ 305 and the positive output of the differential amplifier for a portion of a received packet in the embodiment of the pre-amplifier 320 shown in FIG. 5A.

An electrical signal has driven edges and undriven edges. A driven edge occurs upon a change of state in the current signal. For example, a change of state occurs when the state changes from a logic 'zero' to a logic 'one' or from a logic 'one' to a logic 'zero'. An undriven edge is the decay of the current state of the electrical signal.

As shown, electrical signal 301 has driven edges 510, 512. A driven edge 510, 512 in the electrical signal 301 results in a corresponding rising or falling transition 130 in the AC coupled electrical signal $V_{CONC}$ 305 of the capacitor. An undriven edge in the AC coupled electrical signal 305 is where the voltage of the AC coupled electrical signal 305 decays to $V_{bb}$. $V_{bb}$ is a point of stability half way between logic 'one' and logic 'zero'. For example, an undriven edge occurs when there is a sequence of bits set o 'one' 214 in a received packet. In the AC coupled electrical signal 305, the driven edge 130 and the undriven edge 132 decay at different rates.

Returning to FIG. 5A, the AC-coupled pre-amplifier 320 includes a first resistor $R_{in}$) 202 coupled between the non-inverting input and the inverting input of the differential amplifier 204. A positive feedback resistor (RFB) 203 is coupled between he positive output 302-1 and the non-inverting input of the differential amplifier 204. he AC coupled pre-amplifier 320 provides a driven time constant for each driven edge 130 (FIG. 5C) of the AC-coupled electrical signal 305 and an undriven time constant for each undriven edge 132 (FIG. 5C). The undriven time constant is longer than the driven edge time constant. The driven edge time constant is computed using the following equation:

$$\tau_{driven} = \sqrt{(\tau_{in})^2 + \left(\frac{C_{in}}{I_{in}}\right)^2}$$

where:

$\tau_{in}$=The edge rate of the input to the AC-Coupled pre-amplifier;

$I_{in}$=The available input drive current;

$C_{in}$=Capacitance of coupling capacitor 201.

The differential amplifier 204 has open-loop gain $A_0$. There is positive feedback provided by positive feedback resistor $R_{FB}$ 203 coupled between the non-inverting input of the differential amplifier 204 and the positive output 302-1 of the differential amplifier 204. The undriven edge time constant is computed using the following equation:

$$\tau_{undriven} = R_{in} \cdot C_{in}$$

The differential amplifier 204 extends the decay of an undriven edge 132 (FIG. 5C) of the AC-coupled electrical signal $V_{CONC}$ 305 through the positive feedback resistor $R_{FB}$ 203. At each undriven edge 132 (FIG. 5C) corresponding to a string of 'ones' 214 (FIG. 5C), the voltage of the AC-coupled electrical signal 305 decays to $V_{bb}$ dependent on the undriven edge time constant. The voltage of the AC-coupled electrical signal 305 decays to $V_{bb}$, as the input coupling capacitor discharges through the input resistor 202.

The decay of an undriven edge 132 (FIG. 5C) of the AC-coupled electrical signal 204 occurs because the positive feedback resistor RFB 203 and the input resistor $R_{in}$ 202 form a voltage divider which provides a differential voltage between the inverting input and the non-inverting input of the differential amplifier 204. The ratio between the feedback resistor $R_{FB}$ 203, the input resistor $R_{in}$ 202 is chosen so that the open loop gain of the amplifier $A_0$ does not saturate the output. The decay time of the undriven edge 132 (FIG. 5C) is proportional to the input resistor ($R_{in}$) 202 and the coupling capacitor ($C_{in}$) 201 and is set to be longer than the decay of a driven edge but shorter than the guard time 220 (FIG. 2) between packets.

For hard hysteresis the input voltage $V_j$ must be greater than or equal to the input threshold voltage $V_{inthres}$ as shown below:

$$V_j \geq V_{inthres}$$

where $$V_{inthres} = \frac{V_{LH} - V_{LL}}{Ao}$$

and $$V_j = R_{in} \frac{V_{LH} - V_{bb}}{R_{FB} + R_{in}}$$

substituting for $V_j$ and $V_{inthres}$, $$\frac{V_{LH} - V_{LL}}{A_o} \leq R_{in} \cdot \frac{V_{LH} - V_{bb}}{R_{FB} + R_{in}}$$

where:

$A_0$=open loop gain;
$V_{LH}$=Logic High Voltage;
$V_{LL}$=Logic Low Voltage; and $$V_{bb} = \text{Logic Level Midpoint} = \frac{V_{LH} + V_{LL}}{2}$$

$V_j$=The voltage level feedback to the input; and
$V_{inthres}$=The input voltage necessary to saturate the output.

after substituting for $V_{bb}$ the relationship required between the open loop gain and the resistors to create hard hysteresis is as follows:

$$A_o \geq \frac{2R_{FB}}{R_{in}} + 2$$

To create degenerative hysteresis, the following equation must be satisfied:

$$A_o < \frac{2R_{FB}}{R_{in}} + 2$$

where:

$A_0$=open loop gain;
$R_{FB}$=feedback resistor and
$R_{in}$=input resistor.

The charge stored on the coupling capacitor ($C_{in}$ 201 is discharged through the input resistor ($R_{in}$) 202 This process continues until the voltage at the non-inverting input of the differential amplifier 204 reaches $V_{bb}$. At that time, the decay of an undriven edge is complete. Thus, the undriven time constant is longer than the driven time constant.

The differential amplifier 204 has positive feedback. The positive feedback from the output to the non-inverting input of the differential amplifier 204 is selected so that the output voltage decays slowly and does not maintain itself as in hard hysteresis.

The ratio between the coupling capacitor $C_{in}$ 201 and the input resistor $R_{in}$ 202 are chosen so that there is decay and that the decay is faster than the inter-packet time. The decay exists because the voltage divider comprising $R_{FB}$ and $R_{in}$ provides a voltage across the inverting input and the non-inverting input which when multiplied by the open loop gain of the differential amplifier is less than the current output voltage.

In one embodiment for receiving a 622 Mb per second signal, $C_{inb}$=33 picoFarads, $R_{in}$=75 ohms, $R_{FB}$=3 kilo-ohms and the open loop gain is 40. The relationship between the open loop gain and the resistors is:

$$A_o < \frac{2R_{FB}}{R_{in}} + 2$$

Substituting $A_0$=40, $R_{FB}$=3K and $R_{in}$=75 in the above equation. The relationship between $A_0$, $R_{FB}$ and $R_{in}$ in the embodiment is:

$$40 < 82$$

$C_{in}$ is kept small such that $\tau_{in}$ dominates the driven edge time constant where:

$$\tau_{driven} = \sqrt{\tau_{in}^2 + \left(\frac{C_{in}}{I_{in}}\right)^2}$$

Returning to FIG. 5C, the AC-coupled pre-amplifier 320 increases the saturation time 514b and the discharge time 516b. For example, with a pulse width of 6 ns, the saturation time 514a on $V_{CONC}$ 305 is 12 ns. The AC-coupled pre-amplifier 320 clips the output because of saturation of the differential amplifier during a saturation time 514b for 50 ns and also increases the discharge time 516b.

The value of $R_{in}$ is chosen to limit noise across the inputs of the differential amplifier 204 because any noise is amplified at the output by the differential amplifier 204. Also, the value of $R_{in}$ is chosen to avoid improper loading of the input converter 300. Improper loading can significantly reduce the voltage level of the input signal.

Returning to FIG. 3, a filter 360 is coupled between the pre-amplifier 320 and the comparator with hysteresis 340 to reduce noise on the amplified voltage signal $V_p$ 302. The filter 360 can be a second order Butterworth filter. A Butterworth filter is commonly used to reduce noise and well-known to those skilled in the art. After the filter has reduced the noise on the amplified voltage signal 302, the filtered signal 303 is coupled to a comparator with hysteresis 340.

Figure 5D:
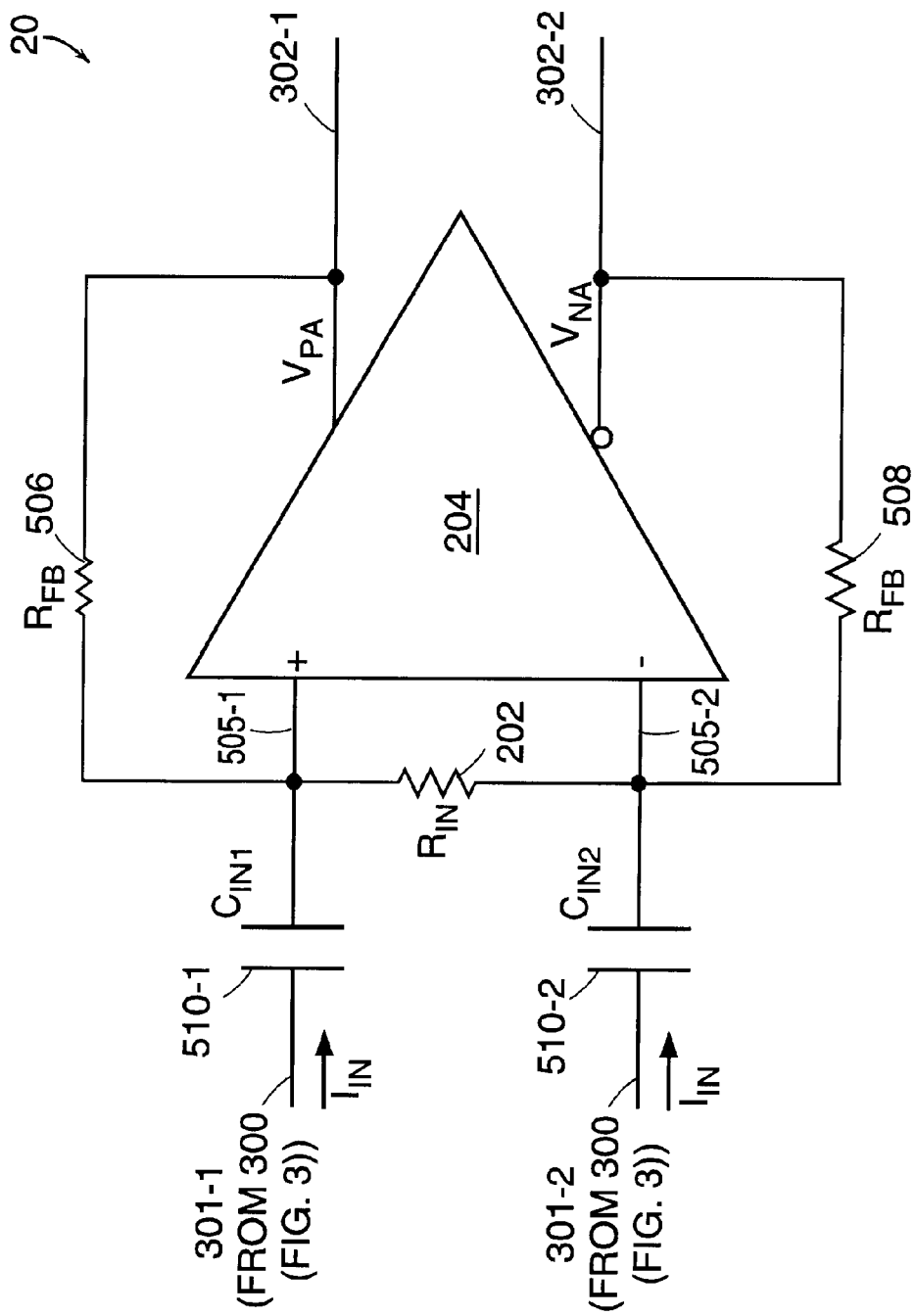
FIG. 5D is a circuit diagram of another embodiment of an AC-coupled pre-amplifier in the burst mode receiver shown in FIG. 3.

FIG. 5D is a circuit diagram of another embodiment of an AC-coupled pre-amplifier in the burst mode receiver shown in FIG. 3. This embodiment differs from the embodiment described in conjunction with FIG. 5A in that the input electrical signal 510-1, 510-2 is differential; that is, the difference between the voltage on signal 510-1 and 510-2.

The AC-coupled pre-amplifier 520 includes an differential amplifier 204 which amplifies a difference in voltage between received input electrical signals 510-1, 510-2 to an amplified difference in voltage between output electrical signals 302-1, 302-2. Each input electrical signal 302-1, 302-2 is coupled to a respective coupling capacitor 510-1, 510-2. AC-coupled electrical signal 505-1 is connected to the noninverting input of the differential amplifier 204 and AC-coupled electrical signal 505-2 is connected to the inverting input of the differential amplifier 204.

An input resistor $R_{in}$ 202 is coupled between the non-inverting input and the inverting input of the differential amplifier 204. A first feedback resistor 506 is coupled between the non-inverting input of the differential amplifier 204 and the positive output of the differential amplifier 204. A second feedback resistor 508 is coupled between the inverting input of the differential amplifier 204 and the negative output of the differential amplifier 204. The resistance of the first feedback resistor 506 and the second feedback resistor 508 can be the same so that the ratio of each respective feedback resistor and the input resistor $R_{in}$ 202 is the same.

Each of the output electrical signals 302-1, 302-2 has a driven edge time constant dependent on the edge rate of the input, and the ratio between the input drive current and the respective coupling capacitor 510-1, 510-2 as described in conjunction with FIG. 5A. The undriven edge time constant of each respective output signal 302-1, 302-3 is dependent on the input resistor $R_{FB}$ 202 and the coupling capacitor 510-1, 510-2 as described in conjunction with FIG. 5A.

The ratio between the respective feedback resistors $R_{FB}$ 506, 508, input resistor $R_{in}$ 202 and the open-loop gain $A_0$ are chosen so that an undriven edge decays. The values of input resistor ($R_{in}$) 202 and coupling capacitors ($C_{in}$) 510-1, 510-2 are chosen such that the decay of an undriven edge of the respective output electrical signal 302-1, 302-2 is faster than the inter-packet time. In the case of balanced feedback resistors, to create degenerative hysteresis, the following equation must be satisfied:

$$A_o < \frac{2R_{FB}}{R_{in}} + 1$$

where:
A=open loop gain
$R_{FB}$=feedback resistor and
$R_{in}$=input resistor.

The differential amplifier 204 has positive feedback through feedback resistor 506 coupled between the non-inverting input and the positive output 302-1 and through feedback resistor 508 coupled between the inverting input and the negative output 302-2.

Thus, the decay of an undriven edge at output electrical signal 302-1 is computed as:

$$\tau_{undriven} = \frac{C_{in} \cdot R_{in}}{2}$$

where:
$\tau_{undriven}$=Undriven edge time constant;
$C_{in}$=coupling and capacitor; and
$R_{in}$=input resistor.

Similarly, the decay of the driven edge at the output electrical signal 302-2 is computed as:

$$\tau_{driven} = \sqrt{\tau_{in}^2 + \left(\frac{C_{in}}{I_{in}}\right)^2}$$

where:
$\tau_{driven}$=driven edge time constant;
$\tau_{in}$=the edge rate of the input to the AC-coupled pre-amplifier; and
$I_{in}$=the available input drive current.

Returning to FIG. 3, a filter 360 is coupled between the pre-amplifier 320 and the comparator with hysteresis 340 to reduce noise on the amplified voltage signal $V_p$ 302. The filter 360 can be a second order Butterworth filter. A Butterworth filter is commonly used to reduce noise and well-known to those skilled in the art. After the filter has reduced the noise on the amplified voltage signal 302, the filtered signal 303 is coupled to a comparator with hysteresis 340.

Figure 6A:
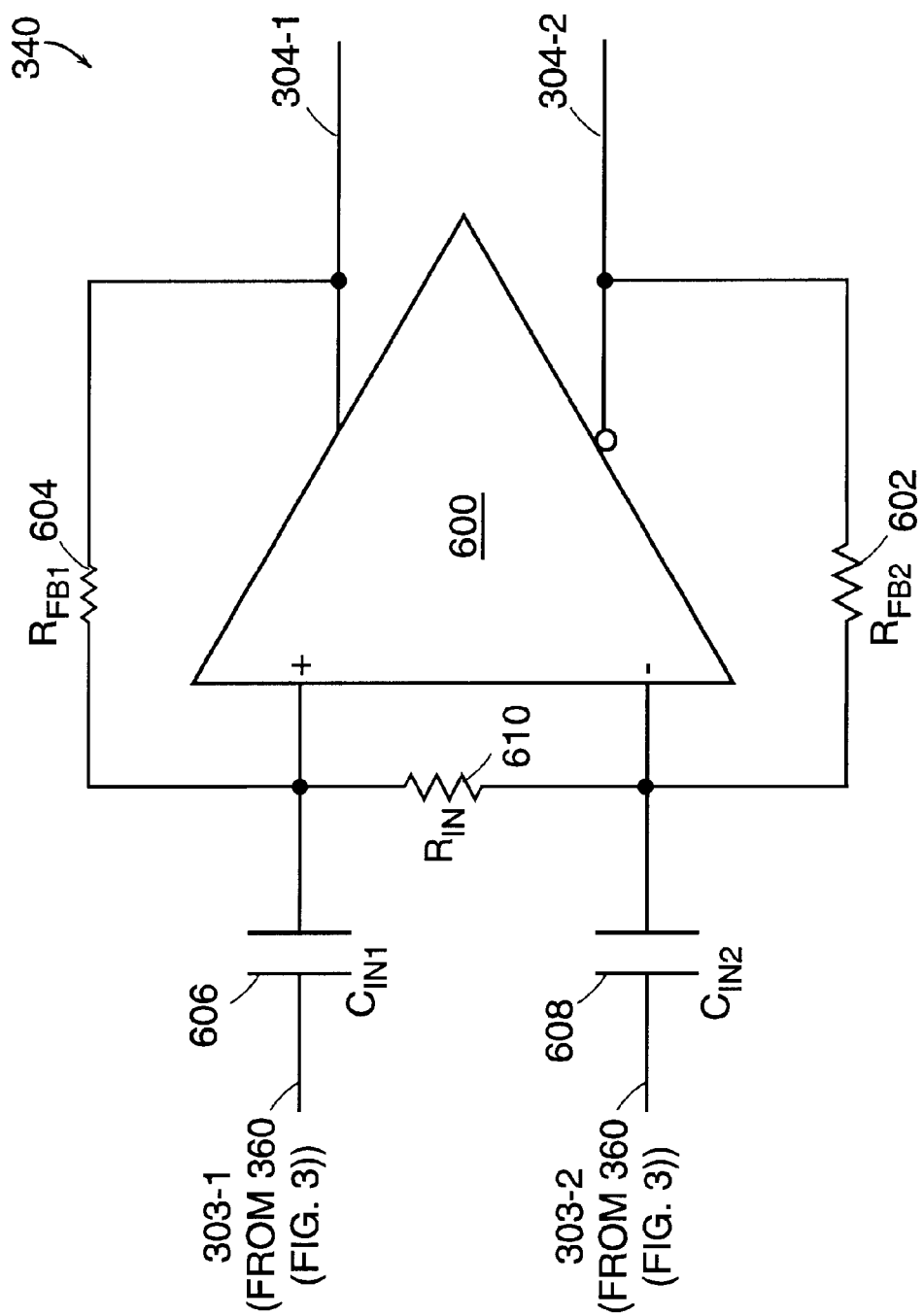
FIG. 6A is a circuit diagram of the comparator with hysteresis in the burst mode receiver shown in FIG. 3.

FIG. 6A is a circuit diagram of the comparator with hysteresis 340 in the burst mode receiver 160 shown in FIG. 3. The comparator with hysteresis 340 includes a comparator 600 with two feedback resistors 602, 604. The positive output 303-1 from the filter 360 (FIG. 3) is coupled to the non-inverting input of the comparator with hysteresis 600 through capacitor 606. The negative output 303-2 from the filter 360 (FIG. 3) is coupled to the inverting input of the comparator with hysteresis 600 through capacitor 608. The comparator with hysteresis 340 has dual positive feedback through the feedback resistors 602, 604. In an embodiment in which the resistance of each of the feedback resistors 604, 602 is 1 Kilo ohms, the input resistor 610 is 510 ohms and the capacitors 606, 608 are each 33 pF, the high pass time constant is 8.4 nano-seconds (255×33 pF) for a system with a pulse width of 6 nano-seconds.

The outputs 304-1, 304-2 of the comparator with hysteresis 600 change state on each rising or falling edge of the input which is faster than the high pass time constant. The high pass filter on the input of the comparator with hysteresis 340 has a sufficiently high 3 dB point such that the slowly decaying power levels of a long string of logic 'ones' or logic 'zeros' are ignored and thus do not affect the previous state. The state of the comparator with hysteresis 600 is set by the driven edge of the first 'one' in a string of 'ones'. The previous state is held until the falling edge after the last 'one' in the string of 'ones' is received. Thus, the capacitors 606, 608 act as high-pass filters allowing a driven edge to pass through and ignoring the slowly decaying power levels of a long string of 'ones' or 'zeros'.

A comparator switches between two possible output values dependent on the difference in voltage between the non-inverting input and the inverting input. A more stable comparator is provided by adding hysteresis to the comparator. A hysteresis region is provided between a first voltage and a second voltage. The comparator switches from one of the output voltages to the other voltage only when the difference in voltage at the input is less than the first voltage or greater than the second voltage. Thus, the comparator with hysteresis acts like a flip-flop with two stable output states.

In comparator 340, the hysteresis region is provided through feedback resistors 604 and 602. Feedback resistor 604 is coupled between the positive output 304-1 and the non-inverting input of the comparator 600. Feedback resistor 602 is coupled between the negative output 304-2 and the inverting input of the comparator 600.

The hysteresis region is dependent on the ratio of feedback resistors 604, 602, the input resistor 610 and the output levels of the comparator 600. The ratio between feedback resistors 604, 602, and the input resistor 610 is chosen dependent on a minimum voltage level to be detected. The hysteresis reduces the effect of noise in the comparison of voltage signals 303-1, 303-2. For example, in an embodiment, in which the minimum voltage level selected is 200 mV, the hysteresis is selected so that any difference in voltage between input voltage signals 303-1 and 303-2 which is below 200 mV is considered noise and ignored.

Figure 6B:
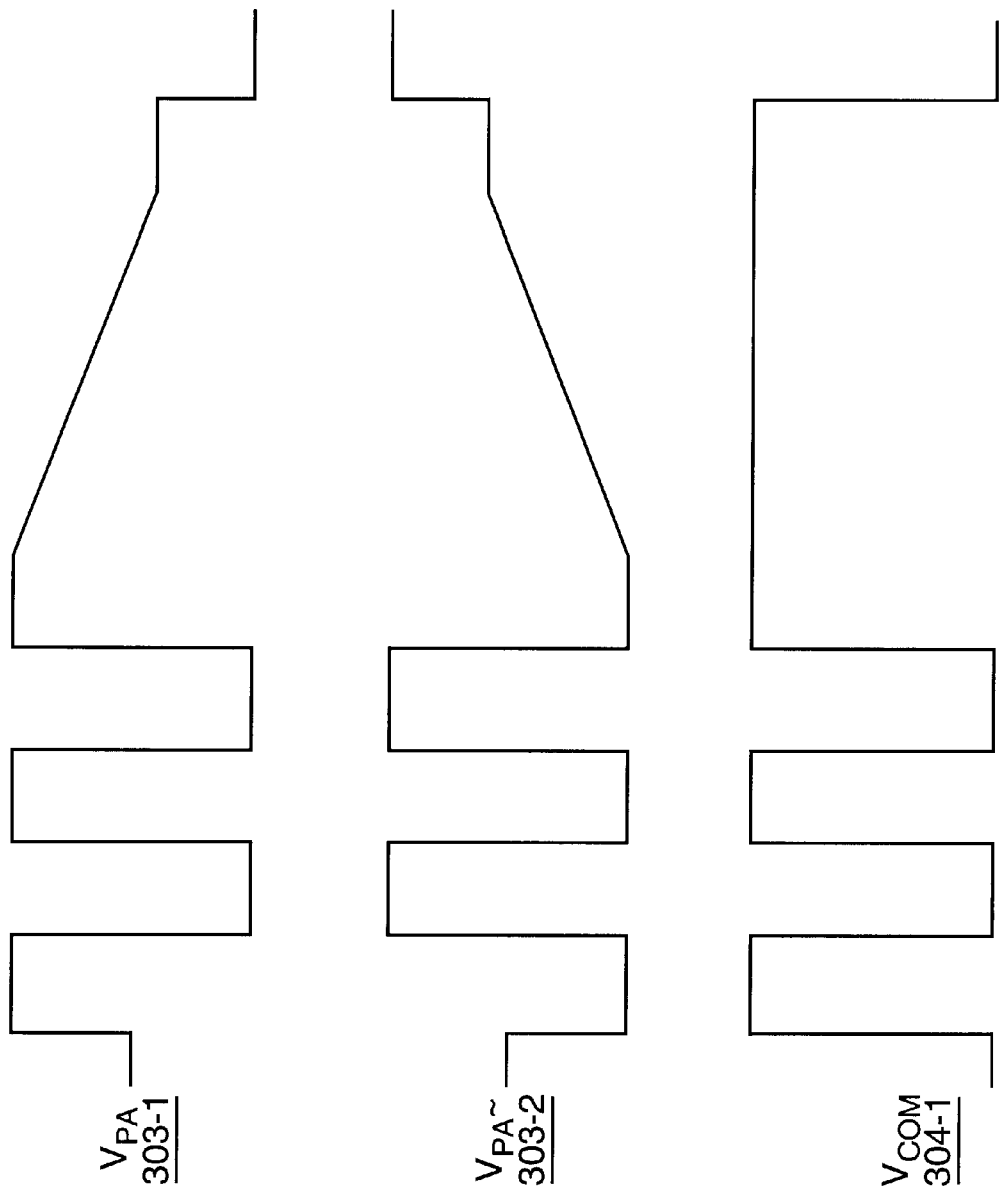
FIG. 6B is a timing diagram illustrating a non-inverted voltage signal and inverted voltage input to the comparator with hysteresis and the non-inverted output signal from the comparator with hysteresis shown in FIG. 6A.

FIG. 6B is a timing diagram illustrating the non-inverted voltage input 303-1, the inverted voltage input 303-2 to the comparator with hysteresis 340 (FIG. 3) and the non-inverted output signal 304-1 from the comparator shown in FIG. 6A. The comparator with hysteresis 340 has two outputs, a positive output 304-1 and a negative output 304-2. The state of the outputs 304-1, 304-2 are dependent on the result of the comparison of input voltage signals 303-1, 303-2. For example, digital signal 304-1 is set to logic 'one' if the non-inverted voltage signal 303-1 is greater than the inverted voltage signal 303-2. The digital signal 304 is set to logic 'zero' if the inverted voltage signal input 303-2 is greater than the non-inverted voltage signal input 303-1.

Figure 7:
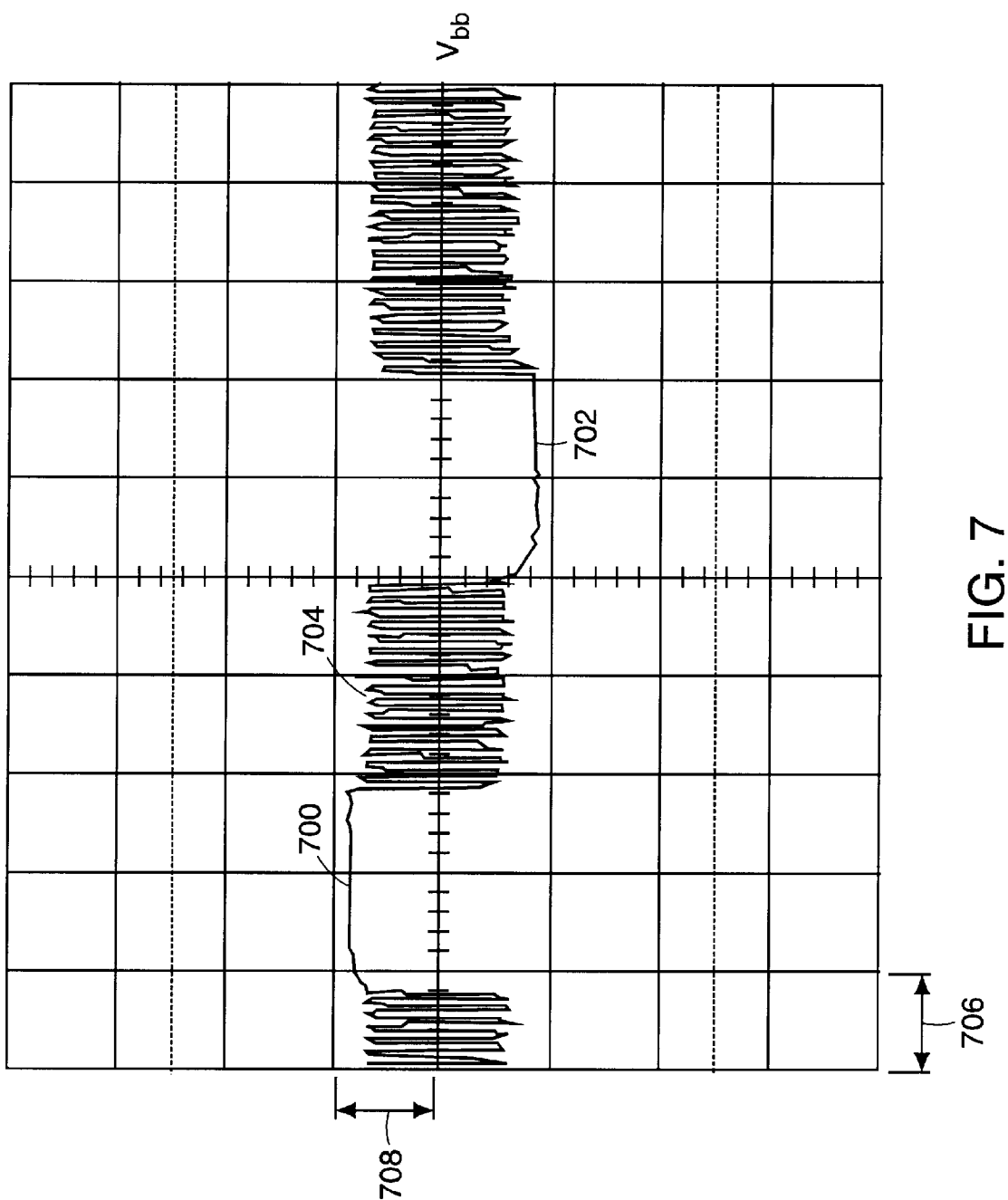
FIG. 7 is a measured trace of the electrical signal at the output of the converter shown in FIG. 4.

FIG. 7 is a measured trace of the electrical signal 301 at the output of the converter 300 shown in FIG. 4 in an embodiment of the invention. FIG. 7 shows data in the middle of a packet 100. The data includes a string of 'ones' 700 and a string of 'zeros' 702 separated by a string of '1010' 704. The time interval 706 is 1 micro-second and the voltage interval 708 is 0.5V. The voltage level for the string of 'ones' 700 and the string of 'zeros' is constant; that is, there is no decay.

Figure 8A:
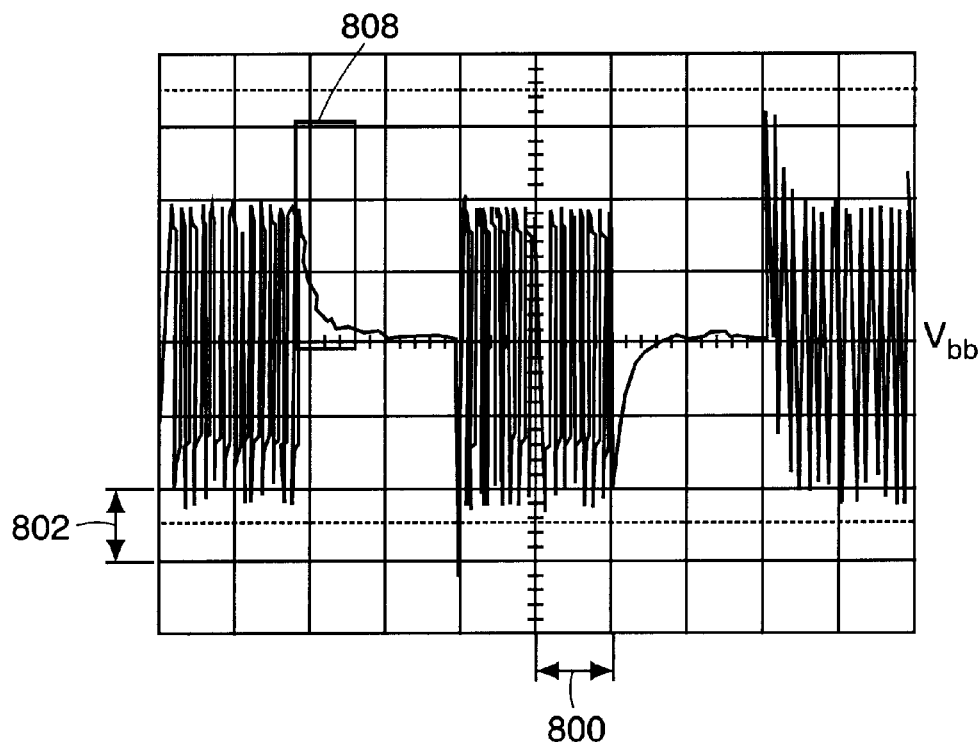
FIGS. 8A–8B are measured traces of an AC-coupled electrical signal at the input of the differential amplifier in the AC-coupled pre-amplifier shown in FIG. 5A corresponding to the output of the converter shown in FIG. 7.
Figure 8B:
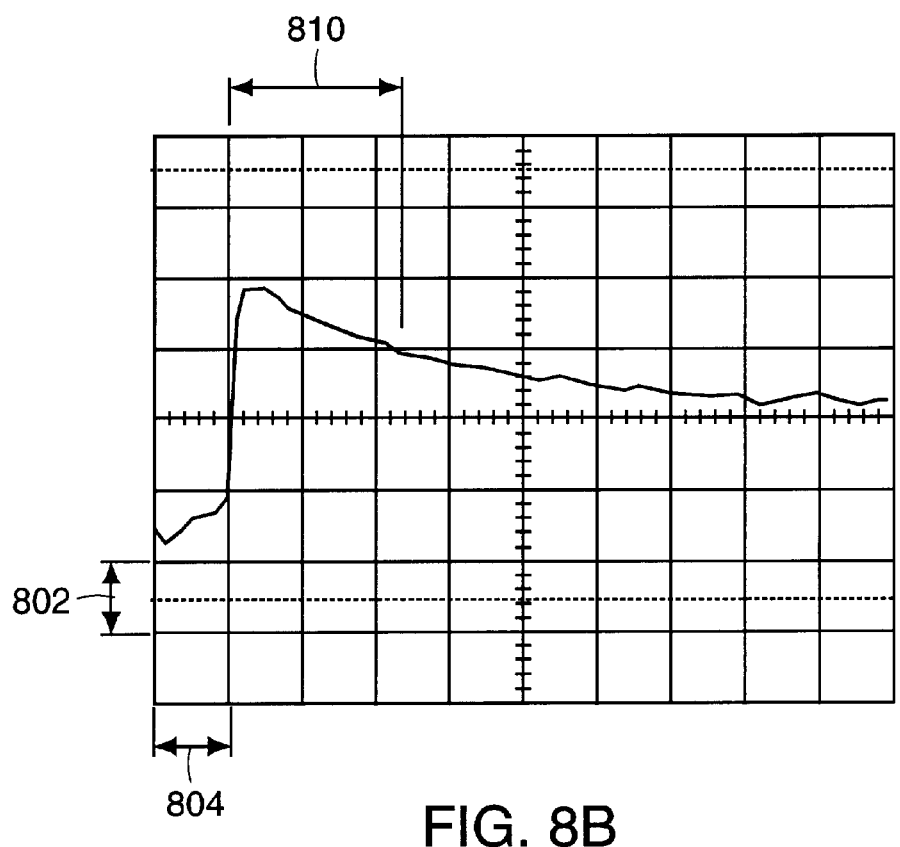

FIGS. 8A to 8B are measured traces of an AC-coupled signal 305 (FIG. 5A) at the input of the AC-coupled differential amplifier in the pre-amplifier 404 shown in FIG. 5A corresponding to the output shown in FIG. 7. The AC-coupled electrical signal 305 (FIG. 5A) includes the same string of 'ones' 700 and a string of 'zeros' 702 separated by a string of "1010" 704 shown in FIG. 7. The time interval 800 is 0.1 micro-second and the voltage interval 802 is 200 milli-Volt ("mV"). The voltage of the AC-coupled electrical signal ranges 300 mV above and below $V_{bb}$. However, the string of 'ones' 700 and the string of 'zeros' 702 of the AC-coupled signal 305 decay rapidly to $V_{bb}$. FIG. 8B expands the measured trace shown in FIG. 8A by changing the time interval 804 to 5 nanoseconds and showing region 808 in FIG. 8A. As shown the saturation time 810 for the string of 'ones' is about 12 nanoseconds for a pulse width of 6 nanoseconds.

Figure 9A:
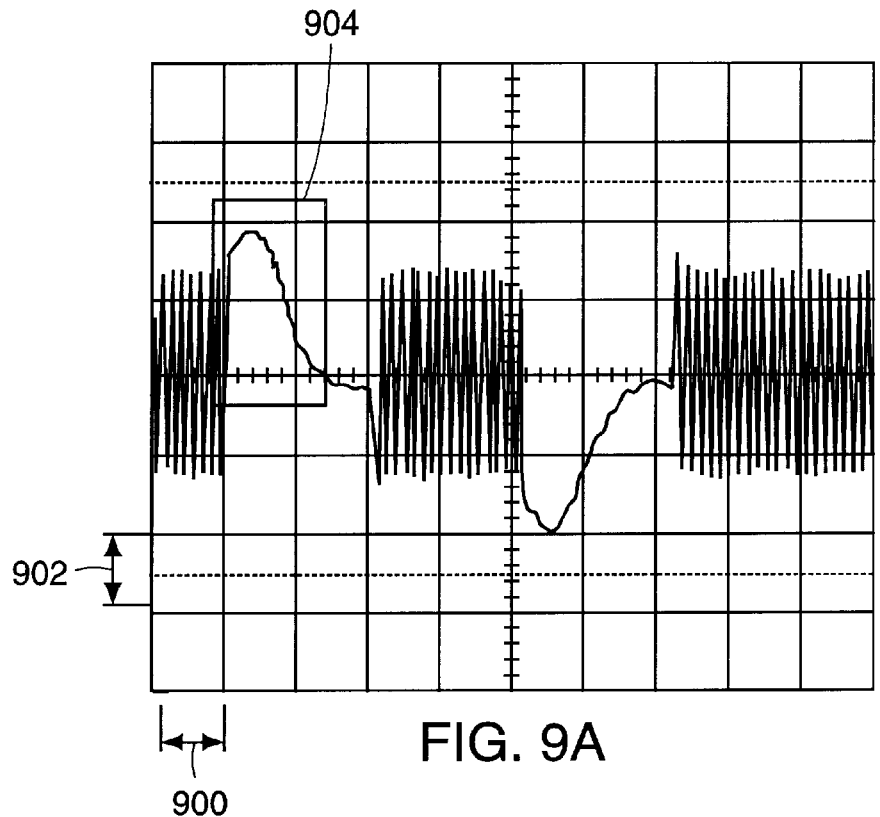
FIGS. 9A–9B are measured traces of the output of the pre-amplifier shown in FIG. 5A corresponding to the AC-coupled signal shown in FIGS. 8A–8B.
Figure 9B:
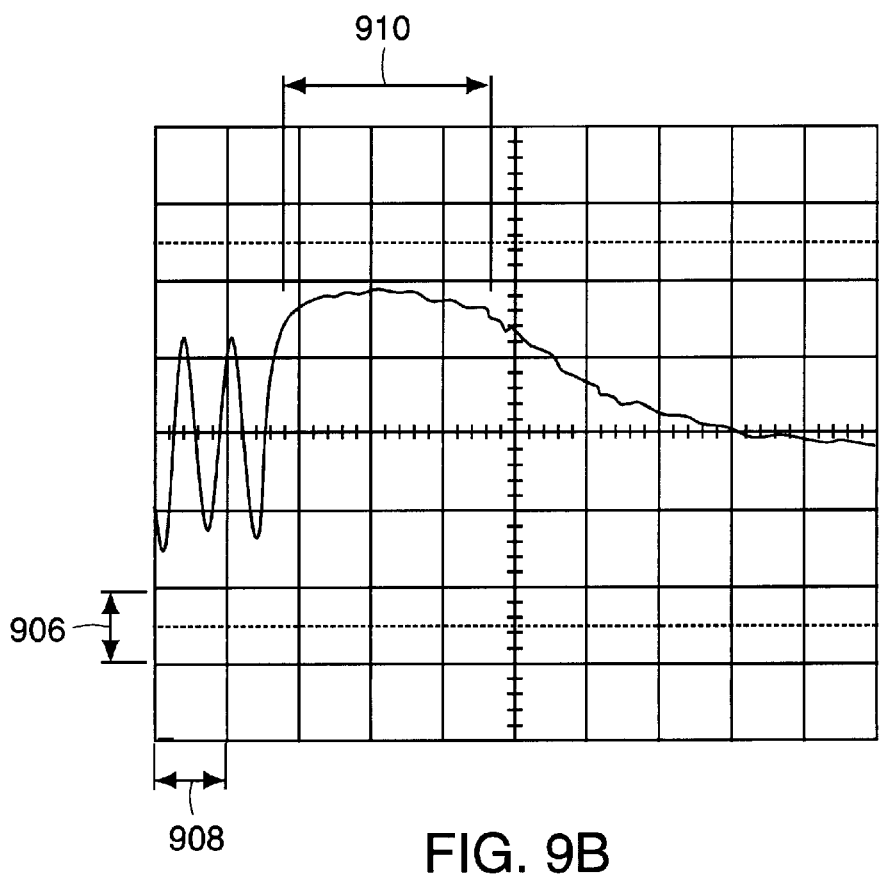

FIGS. 9A to 9B are measured traces of the output of the pre-amplifier shown in FIG. 5A corresponding to the AC-coupled signal shown in FIGS. 8A–8B. The time interval 900 is 0.1 micro second and the voltage interval 902 is 200 mV. The decay time of the string of 'ones' has been extended. FIG. 9B expands the measured trace shown in FIG. 9A by changing the time interval 908 to 10 nanoseconds and showing region 904 in FIG. 9A. As shown, the saturation time for the string of 'ones' has been extended to about 50 nanoseconds for a pulse width of 6 nanoseconds.

Figure 10A:
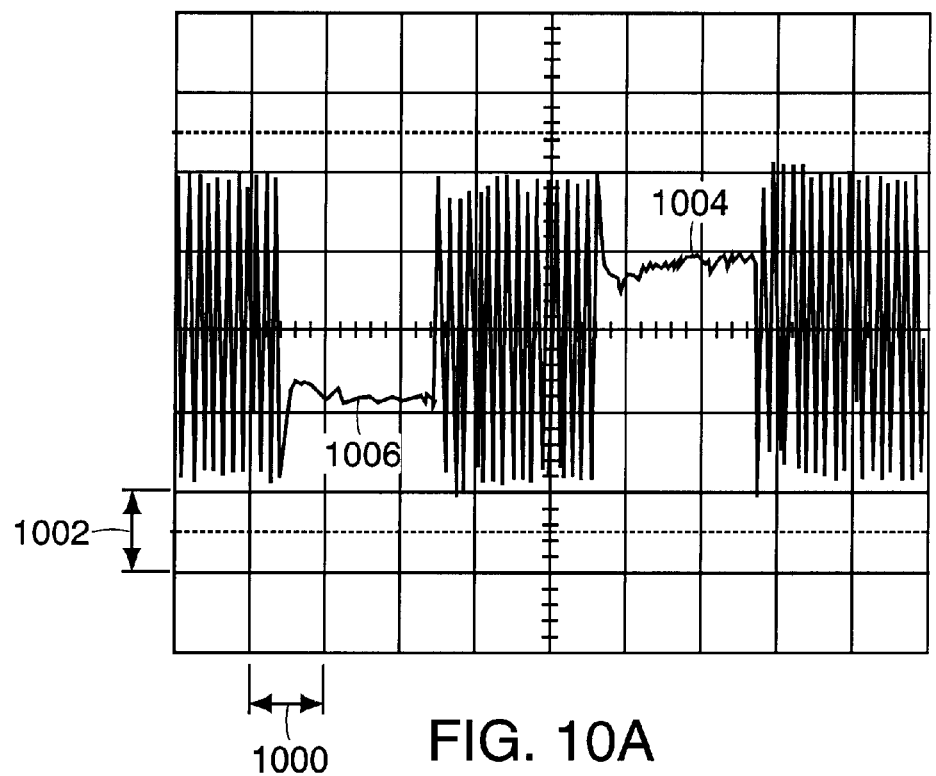
FIGS. 10–10B are measured traces of digital signals at the input of the comparator with hysteresis shown in FIG. 6A.
Figure 10B:
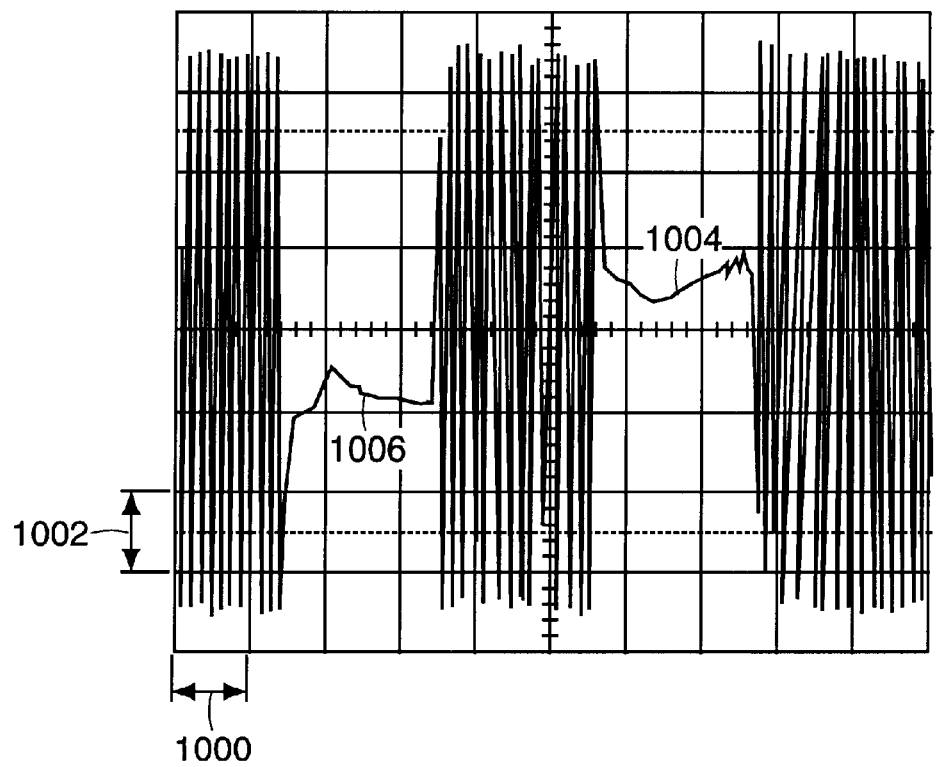

FIGS. 10A–10B are measured traces of digital signals at the input of the comparator with hysteresis 340 shown in FIG. 6A. The scale of both FIG. 10A and FIG. 10B is the same with time interval 1000 of 0.1 micro second and voltage interval 1002 of 50 millivolts. FIG. 10A is a measured trace of a –27 dBm input signal. FIG. 10B is a measured trace of a –7 dBm signal.

Figure 11A:
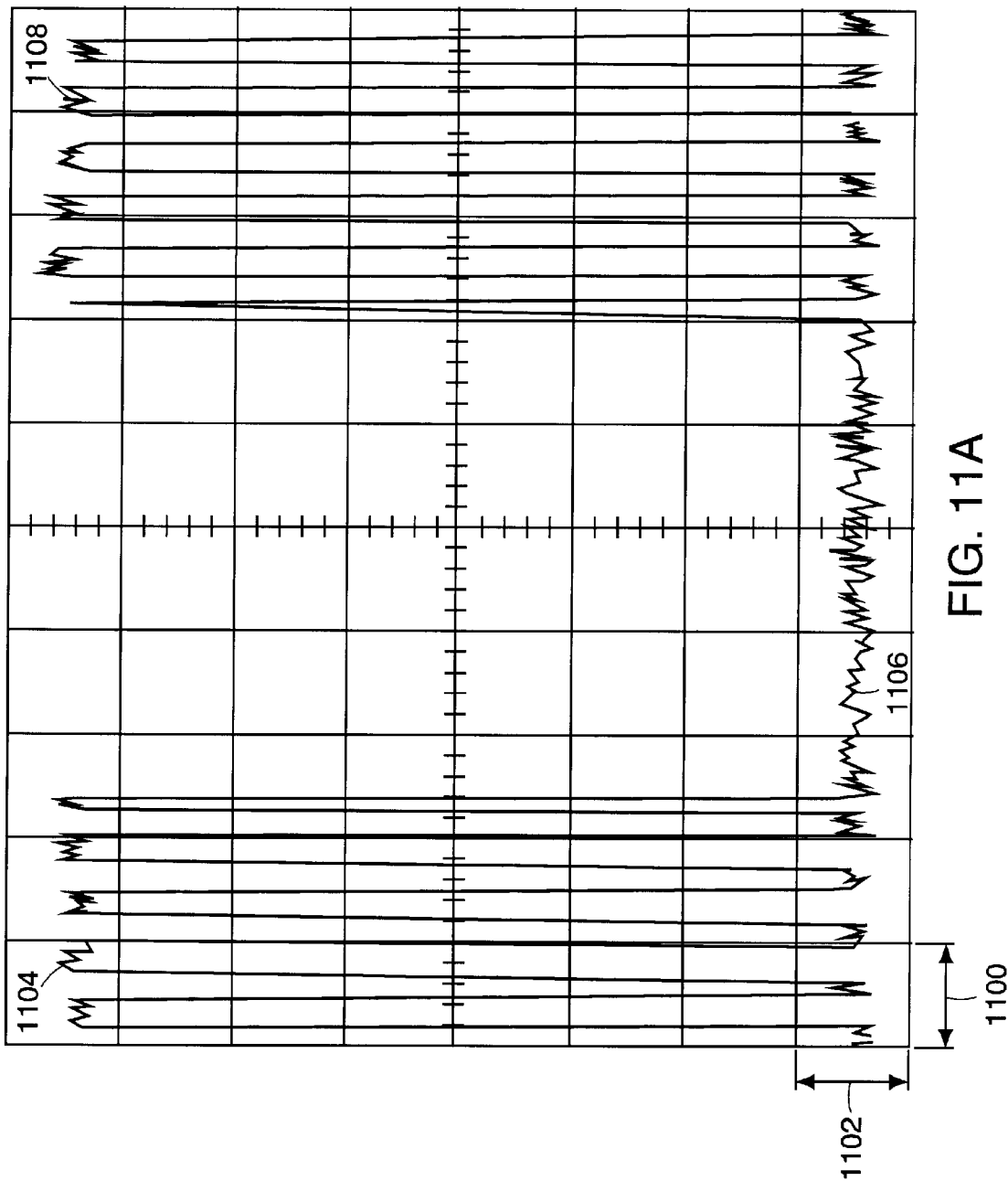
Figure 11B:
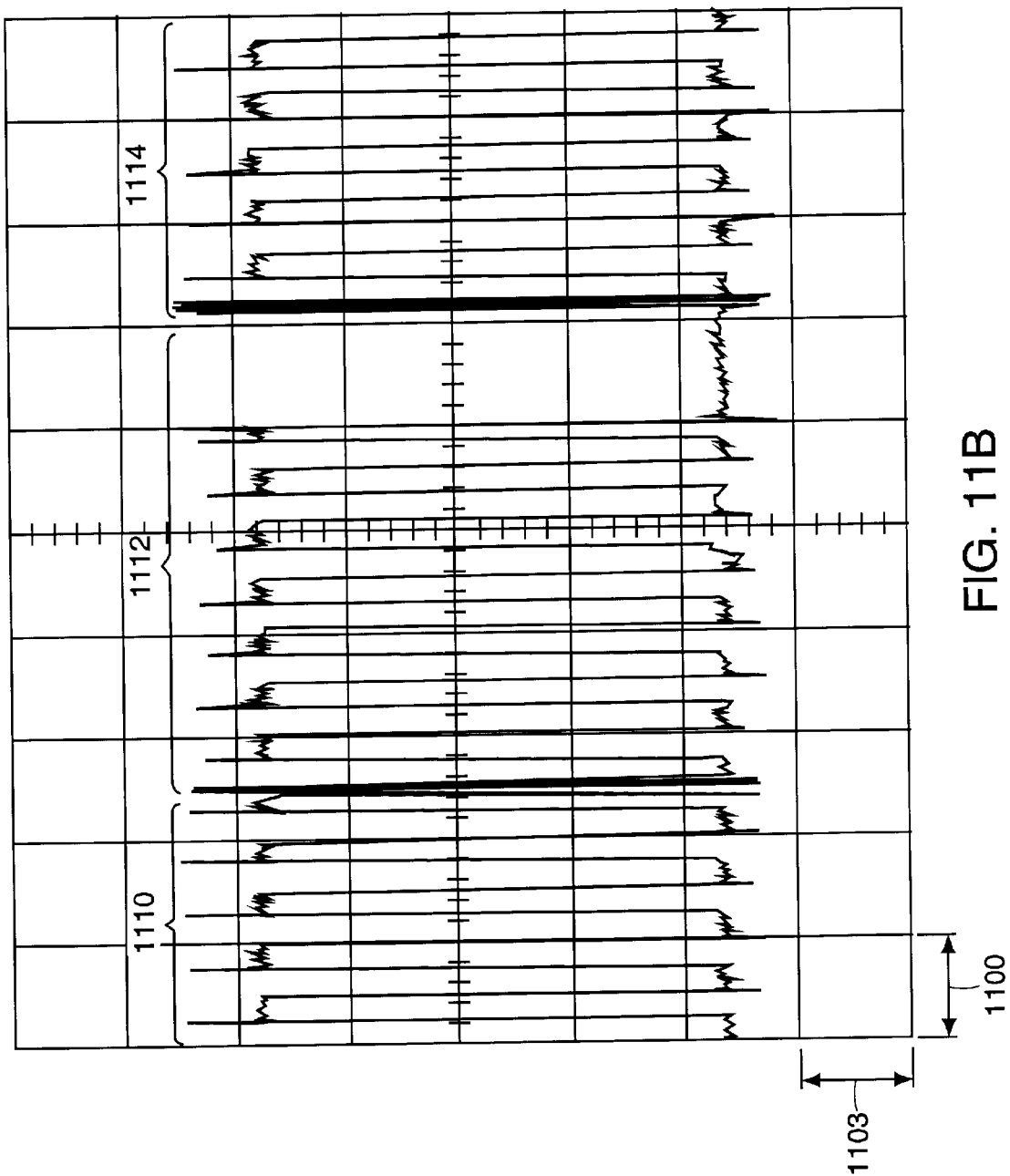

FIGS. 11A–11C are measured traces of optical signals at the input of the burst mode receiver and digital signals at the output of the burst mode receiver shown in FIG. 3. The scale of FIG. 11A is time interval 1100 of 0.2 micro seconds and power interval 1102 of 70 micro Watts.

FIG. 11A is the measured optical signal at the input to the receiver 160 (FIG. 2) that is received over the PON 140 (FIG. 1). The optical signal shown in FIG. 11A includes a portion of a received data packet 1104 with power level of –6 dBm followed by a second data packet 1106 with power level of –23 dBm, followed by a third data packet 1108 with power level of –6 dBm. Data packet 1106 could be mistaken as noise when compared with data packets 1104, 1108.

FIG. 11B is the measured digital signal at the output of the burst mode receiver 160. The scale of FIG. 11 B is time interval 1100 of 200 ns and voltage interval 1103 of 200 mV. Digital signals 1110 correspond to data packet 1104 (FIG. 11A), digital signals 1112 correspond to data packet 1106 (FIG. 11A) and digital signals 1114 correspond to 1108 (FIG. 11A). As shown, the burst mode receiver 160 (FIG. 11A) has amplified the low power data packet 1106 (FIG. 11A) to provide an output digital signal that is the same power level irrespective of the power of the received optical signal.

FIG. 11C is the measured digital signal at the output of the burst mode receiver 160 (FIG. 1) shown in FIG. 11C zoomed in on the last bit 1116 of data packet 1110 (FIG. 11B) andthepreamble 1118 of data packet 1112 (FIG. 11B). The scale of FIG. 11C is time interval 1120 of 5 ns and voltage interval 1102 of 200 mV. Thus, the burst mode receiver 160 (FIG. 1) amplifies weak and strong received optical signals such that the output power level of all received optical signals within a minimum threshold level is the same at the output of the burst mode receiver.

Thus, it can be seen that the burst mode receiver can maintain the output of the system at a constant power level for a large number of bit times. Also, the burst mode receiver is indifferent to the DC threshold levels of the incoming signals because the power level for a large number of bit times is the same. Thus, the burst mode receiver can change its gain sufficiently quickly so that it can respond to the two extremes of power levels that can be received in the inter-packet time.

The invention has been described for receiving packets transmitted in burst mode. However, the invention is not limited to receiving packets transmitted in burst mode, the burst mode receiver can also receive packets transmitted in continuous mode (non-burst mode).

While this invention has been particularly shown and described with references to preferred embodiments thereof, it will be understood by those skilled in the art that various changes in form and details may be made therein without departing from the scope of the invention encompassed by the appended claims.

What is claimed is:

1. An AC-coupled pre-amplifier comprising:
   a capacitor for AC-coupling a signal;
   an amplifier having an inverting input and a non-inverting input, the non-inverting input coupled to the capacitor to receive the AC coupled signal;
   an input resistor coupled between the inverting input and the non-inverting input; and
   a feedback resistor coupled between a positive output of the amplifier and the non-inverting input of the amplifier, the ratio of the input resistor, the feedback resistor and open loop gain of the amplifier selected to produce an undriven time constant for each undriven edge of the AC coupled signal, proportional to the capacitor and the input resistor, which is longer than a driven time constant for each driven edge of the AC coupled signal and shorter than an interpacket guard time.

2. The AC-coupled pre-amplifier as claimed in claim 1 wherein the edge rate of the signal, and the ratio between an input drive current driving the signal and the capacitor control the driven time constant for each driven edge of the second AC-coupled signal.

3. The AC coupled pre-amplifier as claimed in claim 1 further comprising:
   a second feedback resistor coupled between a negative output of the amplifier and the inverting input of the amplifier; and
   a second capacitor which AC-couples a second signal, the inverting input connected to the second capacitor to receive the second AC-coupled signal, the ratio of the input resistor, the second feedback resistor and the open loop gain of the amplifier selected to produce an undriven time constant for each undriven edge of the second AC coupled signal which is longer than a driven time constant for each driven edge of the second AC coupled signal.

4. The AC-coupled pre-amplifier as claimed in claim 3 wherein an edge rate of the second signal, and the ratio between the input drive current driving the second signal and the second capacitor control the driven time constant for each driven edge of the second AC coupled signal.

5. A method for pre-amplifying a signal comprising:
   AC-coupling the signal through an AC-coupling capacitor to output an AC-coupled signal; and
   amplifying the AC-coupled signal in an amplifier, the amplifier having a positive feedback resistor coupled between a non-inverting input and a positive output and an input resistor coupled between the non-inverting input and an inverting input, the proportion of the input resistor and the input capacitor selected to output an amplified AC-coupled signal having an undriven edge time constant corresponding to each undriven edge of the AC-coupled signal and an undriven edge time constant extended and longer than the driven edge time constant corresponding to each driven edge of the AC-coupled signal and less than a guard time between burst mode signals.

6. The method as claimed in claim 5 wherein the input resistor and the capacitor control the undriven time constant for each undriven edge of the AC coupled signal.

* * * * *